(12) United States Patent
Schnabel et al.

(10) Patent No.: US 6,291,335 B1
(45) Date of Patent: Sep. 18, 2001

(54) LOCALLY FOLDED SPLIT LEVEL BITLINE WIRING

(75) Inventors: Rainer Florian Schnabel, Munich (DE); Ulrike Gruening, Wappingers Falls, NY (US); Thomas Rupp, Stormville, NY (US); Gerhard Mueller, Wappingers Falls, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/411,551

(22) Filed: Oct. 4, 1999

(51) Int. Cl.[7] .................................................. H01L 21/4763
(52) U.S. Cl. ........................... 438/626; 438/241; 438/258; 438/618; 438/620; 438/622; 438/625; 438/626; 438/631; 438/633; 438/637; 438/638
(58) Field of Search ..................................... 438/241, 258, 438/618, 622, 620, 625, 626, 631, 633, 637, 638

(56) References Cited

U.S. PATENT DOCUMENTS

| | | | |
|---|---|---|---|
| 5,981,369 | * 11/1999 | Yoshida et al. ...................... 438/597 |
| 6,074,908 | * 6/2000 | Huang .................................. 438/241 |
| 6,117,725 | * 9/2000 | Huang .................................. 438/241 |
| 6,124,199 | * 9/2000 | Gambino et al. .................... 438/622 |
| 6,188,598 | * 2/2001 | Mueller et al. ......................... 365/69 |
| 6,197,639 | * 3/2001 | Lee et al. ............................. 438/258 |
| 6,200,855 | * 3/2001 | Lee ...................................... 438/255 |

* cited by examiner

Primary Examiner—John F. Niebling
Assistant Examiner—Jennifer M. Kennedy
(74) Attorney, Agent, or Firm—Stanton C. Braden

(57) ABSTRACT

A method for fabricating a semiconductor memory with a split level folded bitline structure consisting of three contact levels, in accordance with the present invention includes forming gate structures for transistors in an array region and a support region of a substrate. First contacts are formed down to diffusion regions between the gate structures in the array region. The first contacts have a height which is substantially the same for all first contacts in the array region. Second contacts are formed between first level bitlines in the array region and a first portion of the first contacts, while forming second contacts to a first metal layer from the gate structures and diffusion regions in the support region. Third contacts are formed between second level bitlines in the array region and a second portion of the first contacts, while forming third contacts to a second metal layer from the first metal layer in the support region.

22 Claims, 7 Drawing Sheets

LOCALLY FOLDED SPLIT LEVEL BITLINE WIRING

BACKGROUND

1. Technical Field

This disclosure relates to semiconductor layouts and more particularly, to a method for wiring semiconductor devices which includes providing a local split level bitline wiring scheme with reduced contact levels.

2. Description of the Related Art

Semiconductor memories typically include an array of memory cells disposed in rows and columns. Rows and columns are generally defined by wordlines and bitlines which are used to access the memory cells. Bitlines generally are employed for reading and writing data to and from the memory cells. For dynamic random access memory cells (DRAMs), it is desirable for the bitline pairs to be included in a structure that reduces noise between the bitline pairs during operation.

One method for reducing noise includes a folded bitline scheme. This means that an active bitline is neighbored by a passive bitline which serves as a reference bitline during read/write cycles. The folded bitline structure is relatively easy to implement in a horizontal arrangement. This horizontal arrangement cannot be easily extended to structures where two metal layers are employed for alternating bitlines, especially for sub-8F$^2$ memory cells (where F is a minimum feature size for a given technology).

In one conventional architecture, a globally folded bitline scheme has been attempted. In the globally folded bitline scheme, two neighboring bitlines each include a same number of memory cells, globally. Locally however, the next neighboring memory cells of a given bitline do not belong to the adjacent bitline. Instead, neighboring memory cells are, for the most part, connected to the same bitline. This scheme is a non-optimized arrangement for the bitlines, especially from a noise minimization standpoint.

Referring to FIG. 1, a globally folded bitline structure 10 is shown. Structure 10 includes a first layer 12 and a second layer 14. The first layer 12 and second layer 14 include alternating portions 13 of bitlines 16, and may be referred to as a twisted bitline architecture. Bitlines 16 include a first bitline BL1 and a second bitline BL2. BL1 and BL2 alternate positions between the first layer 12 and the second layer 14. BL2 is employed as a reference for BL1 (and vice versa). The reference bitline (e.g. BL2) does not connect to cells 18 in the vicinity of the cells 18 of a given bitline (e.g., BL1). Instead, a group of cells 22 are connected to BL1, and another group of cells 24 are connected to BL2. Since neighboring cells of each group connect to the same bitline, noise is easily introduced. In other words, all the cells of the group 22 connect to BL1 while all the cells of the group 24 are connected to BL2.

Referring to FIG. 2, a schematic representation of a locally folded bitline arrangement or structure 100 is shown. Structure 100 includes a first bitline 102 and a second bitline 104. First bitline 102 is formed in a first layer 106 and second bitline 104 is formed in a second layer 108. Bitlines 102 and 104 do not alternate positions between layers as described above. Instead, each bitline 102 connects to every other memory cell 110, and bitline 104 connects to memory cells 110 adjacent to the memory cells connected to by bitline 102. In this way, nearest neighbor cells are each connected to different bitlines. Each bitline 102 and 104 acts as a reference for the other of bitlines 102 and 104 to reduce noise within signals traveling along bitlines 102 and 104 during read/write cycles, for example. However, providing two-level bitline wiring is often challenging due to the need for additional contact space and processes.

Referring to FIG. 3, a cross-sectional view of a conventional split level bitline wiring scheme is shown for a dynamic random access memory device 120. Device 120 includes a silicon substrate 122. Substrate 122 primarily includes two main regions, an array region 124 and a support region 126. Array region 124 includes a plurality of memory cells each including a gate structure 128 for an access transistor 130 for accessing a storage capacitor (not shown) in substrate 122. Contacts 132 and 134 are employed to connect diffusion regions 136 of access transistors to bitlines 138 and 140. Bitlines 138 and 140 are on different levels.

In support region 126, logic devices and other support circuitry are provided. A transistor 142 includes a gate structure 144. A contact 146 connects to gate structure 144 while a contact 148 connects to a diffusion region 150 of transistor 142. Contacts 146 and 148 are later connected to an upper metal layer 152 by contacts 154. Contacts 146 and 148 are bordered contacts. Contacts 132, 134, 146 and 148 are formed in four different processes as indicated in squares with numbers 1–4. Contact 132 is formed in a first contact forming process. Contacts 146 and 148 are formed in a second contact forming process. Contact 134 to a second metal layer is formed in a third contact forming process. Contacts 154 are formed in a fourth contact forming process.

Therefore, a need exists for a locally folded bitline arrangement for a multiple level bitline wiring scheme which includes fewer processing steps. A further need exists for a method for providing the locally folded bitline structure with a layout area savings.

SUMMARY OF THE INVENTION

A method for fabricating a semiconductor memory with a split level folded bitline structure consisting of three contact levels, in accordance with the present invention includes forming gate structures for transistors in an array region and a support region of a substrate. First contacts are formed down to diffusion regions between the gate structures in the array region. The first contacts have a height which is substantially the same for all first contacts in the array region. Second contacts are formed between first level bitlines in the array region and a first portion of the first contacts, while forming second contacts to a first metal layer from the gate structures and diffusion regions in the support region. Third contacts are formed between second level bitlines in the array region and a second portion of the first contacts, while forming third contacts to a second metal layer from the first metal layer in the support region.

A method for fabricating a dynamic random access memory with a twisted split level folded bitline structure consisting of three contact levels includes forming gate structures for transistors in an array region and a support region of a substrate. First contacts to diffusion regions between the gate structures in the array region are formed. The first contacts have a height which is substantially the same for all first contacts. A first dielectric layer is patterned over the gate structures in the array region and the support region. Second contacts are formed between first level bitlines in the array region and a first portion of the first contacts, while forming second contacts to a first metal layer from the gate structures and diffusion regions in the support region. The second contacts are formed through the first dielectric layer. A second dielectric layer is patterned over the first level bitlines in the array region and the first metal layer in the support region. Third contacts are formed between second level bitlines in the array region and a second portion of the first contacts, while forming third contacts to a second metal layer from the first metal layer in the support region. The third contacts are formed through the second dielectric layer.

In alternate methods, the first contacts are preferably borderless contacts. The first level bitlines and first metal line may be included on an M0 layer, and the second level bitlines and second metal line may be included on an M1 layer. The first level bitlines may function as an electrical reference for the second level bitlines, and the second level bitlines may function as an electrical reference for the first level bitlines. The first and the second bitlines are preferably local bitlines. The third contacts are preferably borderless contacts. The first level bitlines may be formed with the second contacts in a dual damascene process, and the second level bitlines may be formed with the third contacts in a dual damascene process. At least one of the first level bitlines and the second level bitlines may include tungsten. At least one of the second contacts and the third contacts may include tungsten.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

The present invention provides a locally folded bitline scheme which minimizes noise and connects nearest neighboring memory cells to a reference bitline for any given bitline. The present invention describes a method for forming bitlines to provide the locally folded bitline structure in which only three contact levels are employed.

Figure 4:
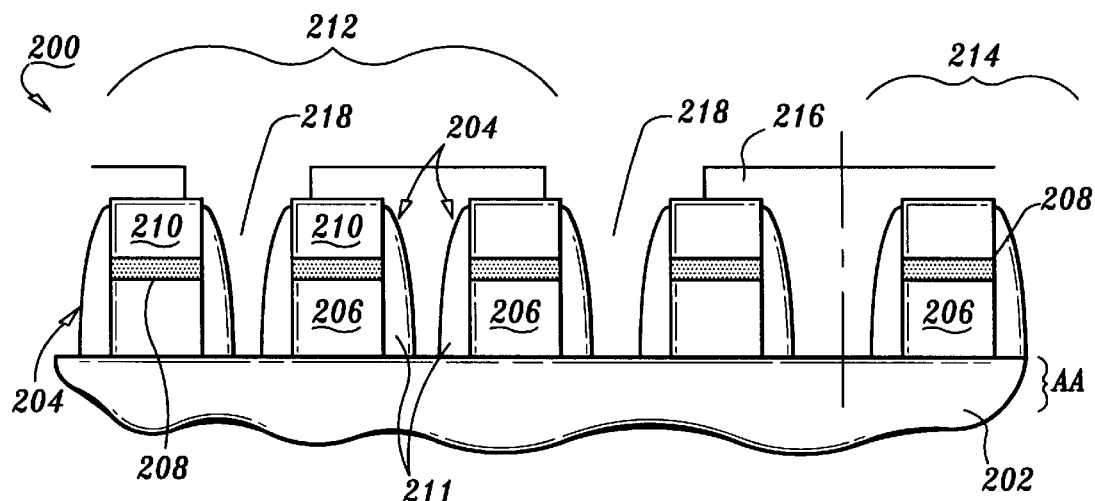
FIG. 4 is a cross-sectional view of a semiconductor device showing holes formed between gate conductors for contacts in accordance with the present invention.

Referring now in specific detail to the drawings in which like reference numerals identify similar or identical elements throughout the several views, and initially to FIG. 4, a semiconductor device 200 is provided for forming a structure in accordance with the present invention. Device 200 includes a substrate 202 having diffusion regions, dielectric materials and conductive materials formed thereon for various components of the structure. Such structures are known to those skilled in the art. For semiconductor memories these components may include, inter alia, transistors, deep trench capacitors and shallow trench isolation regions. An upper portion of the substrate 202 is commonly referred to as active area (AA). The present invention includes a method for forming a semiconductor memory device such as a dynamic random access memory (DRAM) or the like. The present invention may also find application in other semiconductor devices such as processors, embedded DRAM, application specific integrated circuits (ASICs), etc. Since processing of semiconductor device, such as a memory device includes both an array area (or region) 212 and a support area (or region) 214, both areas are depicted in the FIGS. Gate structures 204 are formed by depositing a gate stack including a gate conductor 206, a high conductive layer 208 and a gate cap layer 210. The gate stack is patterned to form gate structures 204 as is known in the art. Gate conductor 206 preferably includes polysilicon, and more preferably doped polysilicon. High conductive layer 208 preferably includes a metal silicide such as tungsten silicide or the like. Gate cap layer 210 and spacers 211 are preferably formed from a nitride and electrically insulate gate conductor 206 and high conductive layer 208. Gate conductor 206 and high conductive layer 208 form wordlines for device 200. Wordlines extend into and out of the page in FIGS. 4–11 in array area 212.

A dielectric layer 216 is deposited over gate structures 204. Dielectric layer 216 may include a glass material, such as boro-silicate glass (BSG) or boro-phosphorous silicate glass (BPSG) which fills in gaps between and covers gate structures 204. A top surface of dielectric layer 216 is then planarized to provide an appropriate surface for additional processing steps. Dielectric layer 216 is patterned to form openings 218 for forming contacts in later steps. Openings 218 are formed between gate structures 204 preferably in every other position as shown in FIG. 4.

Figure 5:
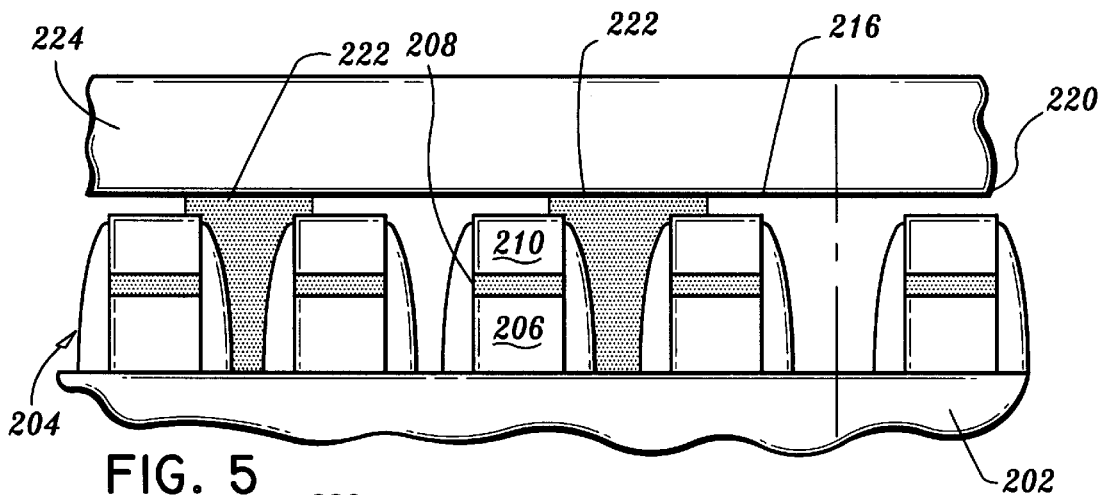
FIG. 5 is a cross-sectional view of the semiconductor device of FIG. 4 showing contacts formed between gate conductors in accordance with the present invention.

Referring to FIG. 5, openings 218 are filled with a conductive material, preferably including polysilicon, by depositing the conductive material in openings 218 down to substrate 202. A surface 220 may be covered with conductive material. A planarization of surface 220 is performed to form contacts 222 in openings 218 such that electrical continuity is provided through contacts 222 to substrate 202.

Figure 3:
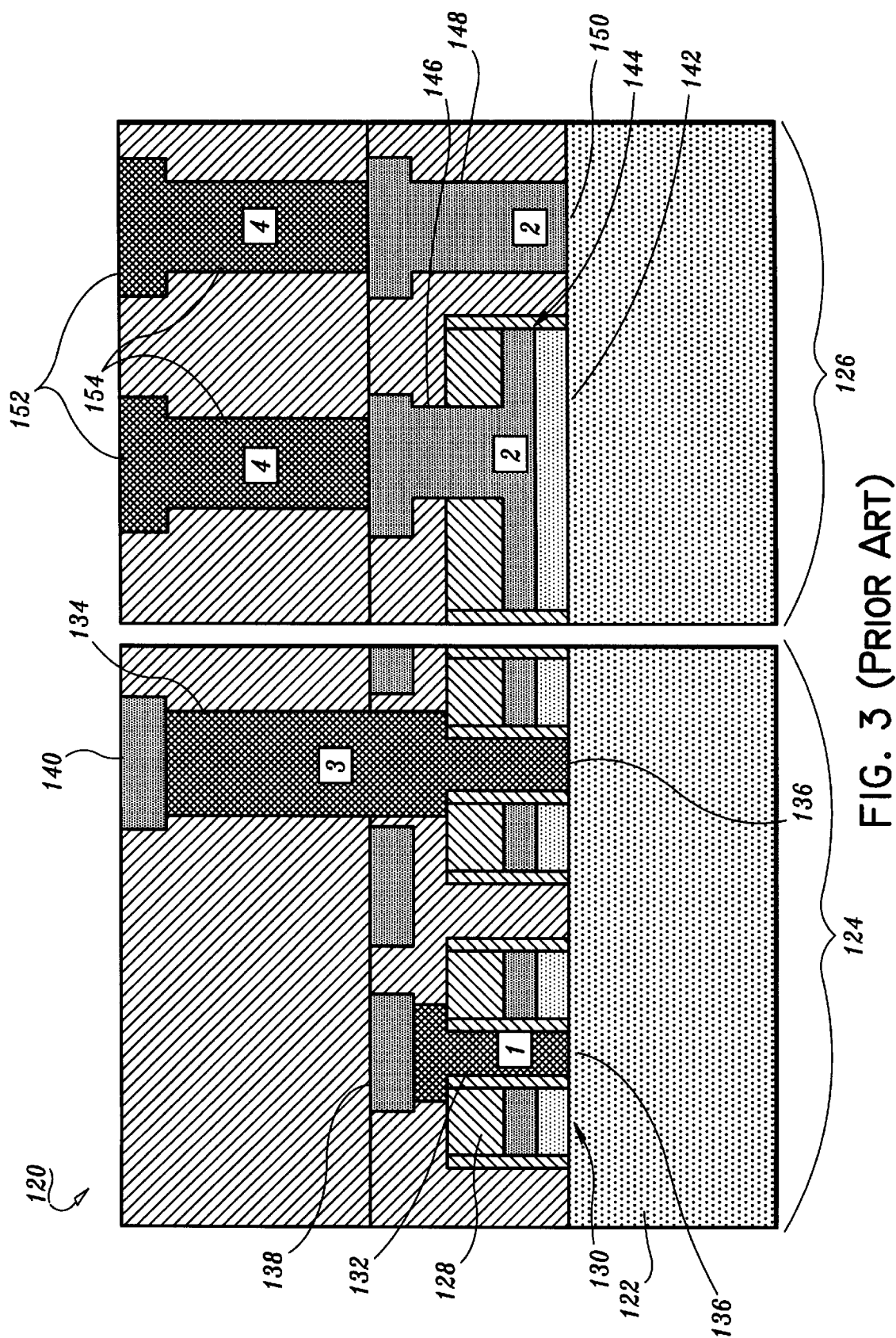
FIG. 3 is a cross-sectional view of a semiconductor device showing four contacts levels in accordance with the prior art.

Contacts 222 are preferably borderless contacts, and contacts 222 are formed concurrently for both M0 and M1 bitline contacts formed in later steps, although other metal layers may also be employed in addition to or in combination with layers M0 and M1. Advantageously, in accordance with the invention, contacts 222 are formed at the same time for bitlines of two levels. As described above with reference to FIG. 3, contacts 134 and 136 of the prior art are formed in separate steps. For the present invention, contacts 222 are formed together and are made to eliminate an entire contact level formation process. Contacts 222 are preferably formed with polysilicon. After planarizing surface 220 an interlevel dielectric layer 224 is deposited. Interlevel dielectric layer 224 may include a glass, such as, BSG, BPSG or other dielectric materials.

Figure 6:
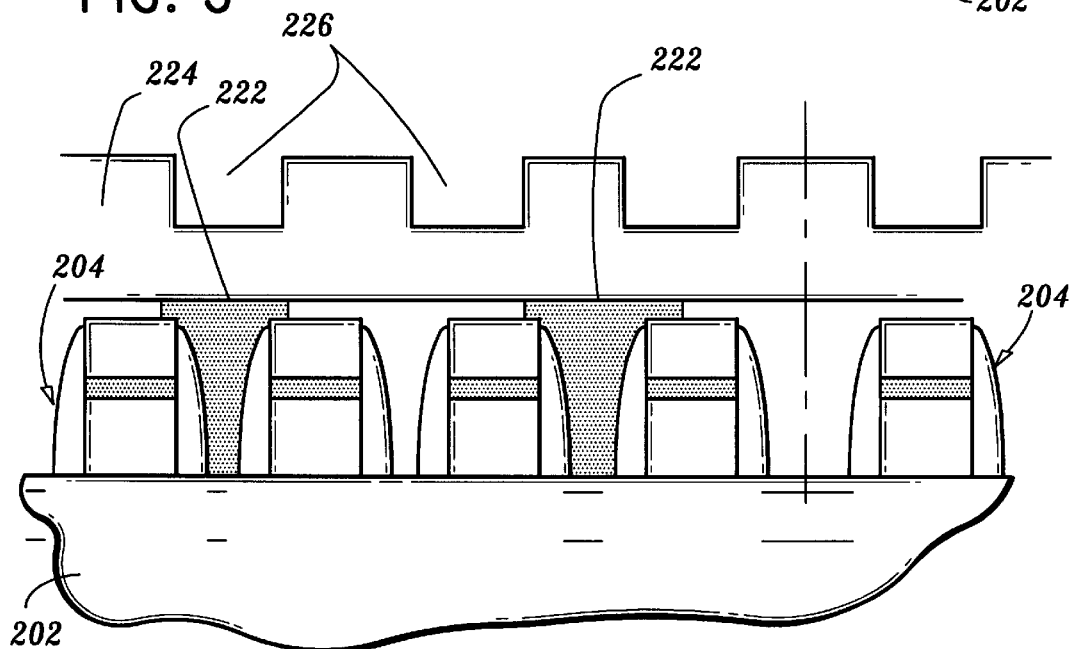
FIG. 6 is a cross-sectional view of the semiconductor device of FIG. 5 showing trenches formed for bitlines on a first layer in accordance with the present invention.

Referring to FIG. 6, interlevel dielectric layer 224 is patterned using conventional photolithographic techniques to form trenches 226 therein. Trenches 226 are employed to connect to metal lines and contacts as will be described below.

Figure 7:
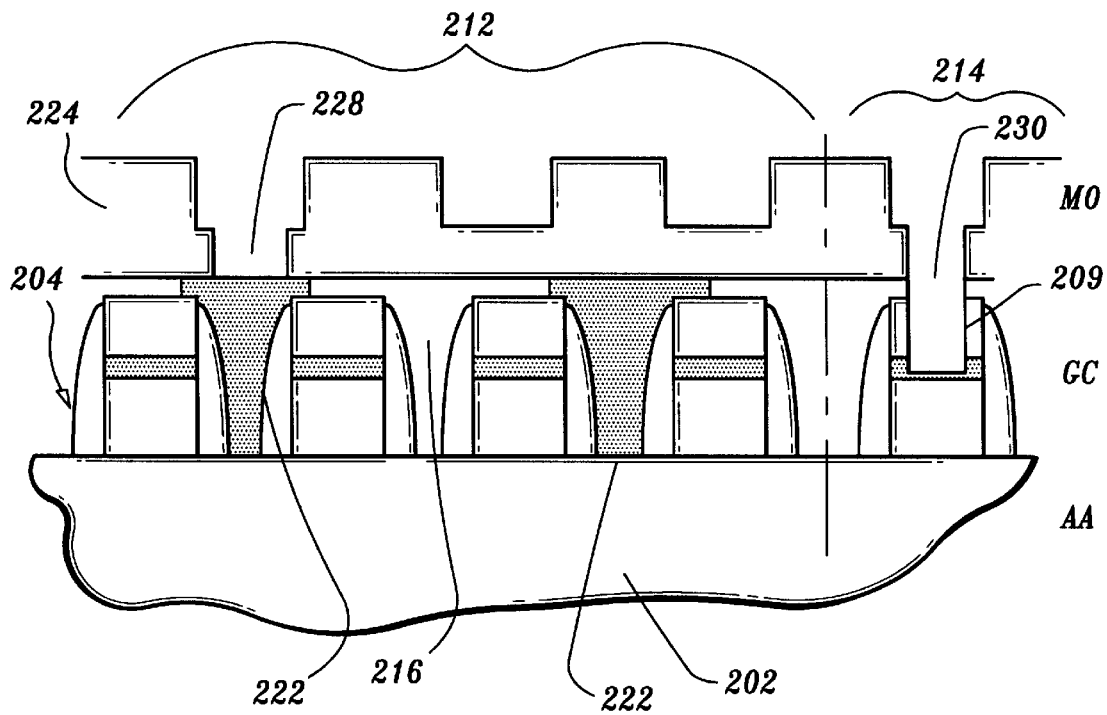
FIG. 7 is a cross-sectional view of the semiconductor device of FIG. 6 showing contact holes formed for contacts to the bitlines in the first layer in accordance with the present invention.

Referring to FIG. 7, interlevel dielectric layer 224 is patterned again to open holes 228 down to contact 222. In support region 214, holes 230 are also formed for contacts through interlevel dielectric layer 224, dielectric layer 216 and into a gate cap 209. This may be performed using etching processes and chemistries known to those skilled in the art.

Figure 8:
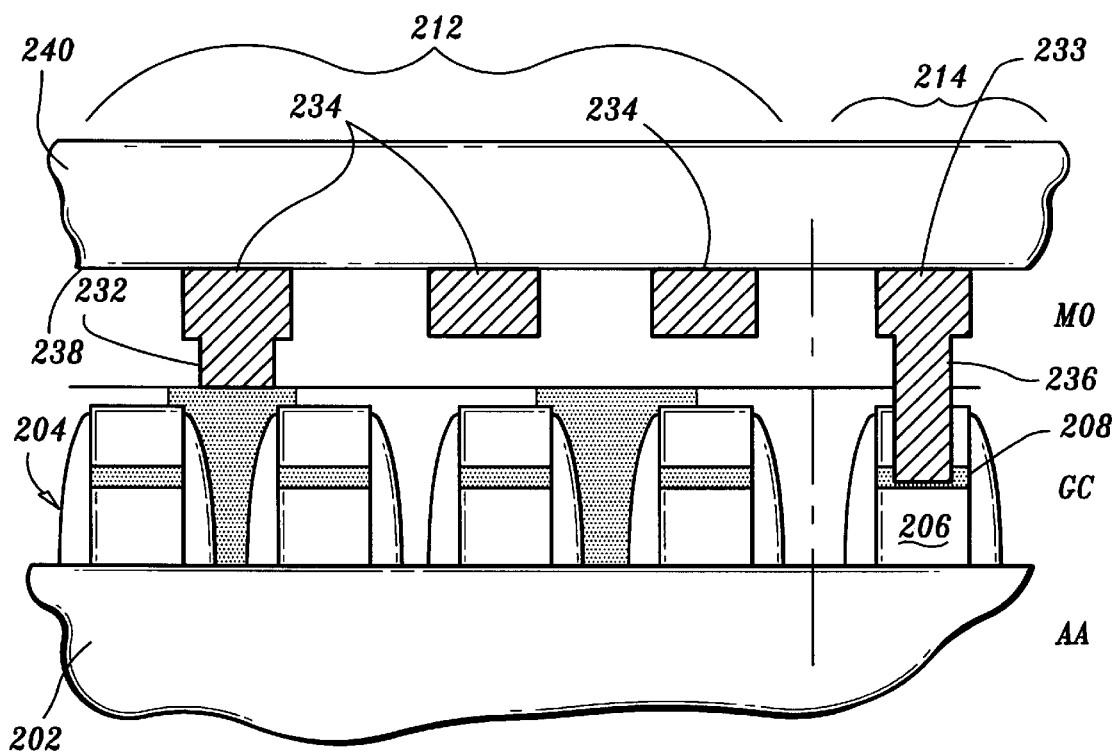
FIG. 8 is a cross-sectional view of the semiconductor device of FIG. 7 showing contacts and bitlines formed for the first layer of bitlines in accordance with the present invention.

Referring to FIG. 8, conductive material is now deposited to form structures in the M0 layer. These structures include contacts 232, bitlines 234 and contacts 236 in support region 214. Contacts 232 and bitlines 234 may be formed concurrently in a dual damascene process. Conductive material for M0 structures may include tungsten, aluminum, polysilicon or other suitable conductive materials. A surface 238 is planarized to remove conductive material and to prepare surface 238 for additional layers. Contacts 236 are formed in support regions 214 directly to gate conductor 206/conducive layer 208. Contact 236 and a metal line 233 may be formed concurrently in a dual damascene process.

Since support region 214 includes logic support circuitry, discrete devices in support area may be individually controlled and therefore may be individually accessed. Long wordlines are not typically employed in support area 214 and devices such as individual transistors are enabled by directly accessing and activating gate conductors 206. Contact 236 may be connected to metal line 233 and be formed using a dual damascene process. Contact 236 is a bordered contact.

Contacts 232 and 236 denote a second contact level wherein the first contact level includes contacts 222. Another interlevel dielectric layer 240 is now deposited over layer 224. Layer 240 may include the same materials as layer 224.

Figure 9:
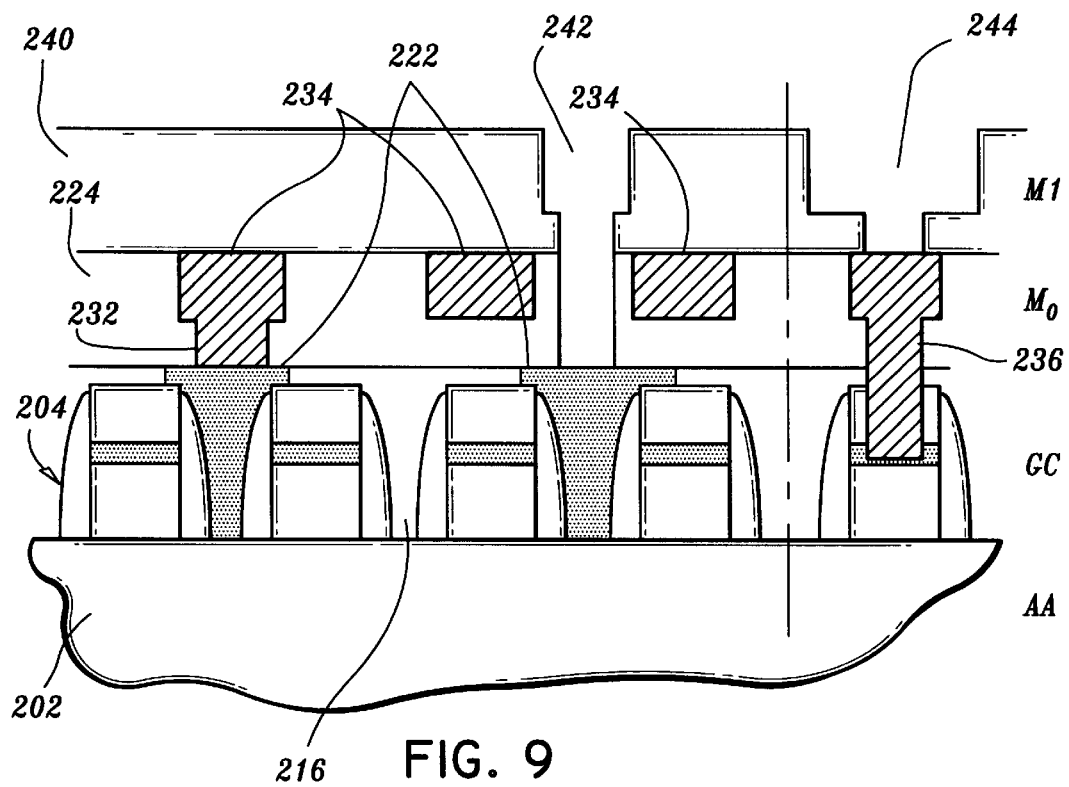
FIG. 9 is a cross-sectional view of the semiconductor device of FIG. 8 showing contact holes and bitline holes formed for a second layer of bitlines in accordance with the present invention.

Referring to FIG. 9, layer 240 is patterned to form holes 242 for contacts from M1 layer to contacts 222. Holes 244 are also patterned in layer 240 to access contact 236 from higher layers.

Figure 1:
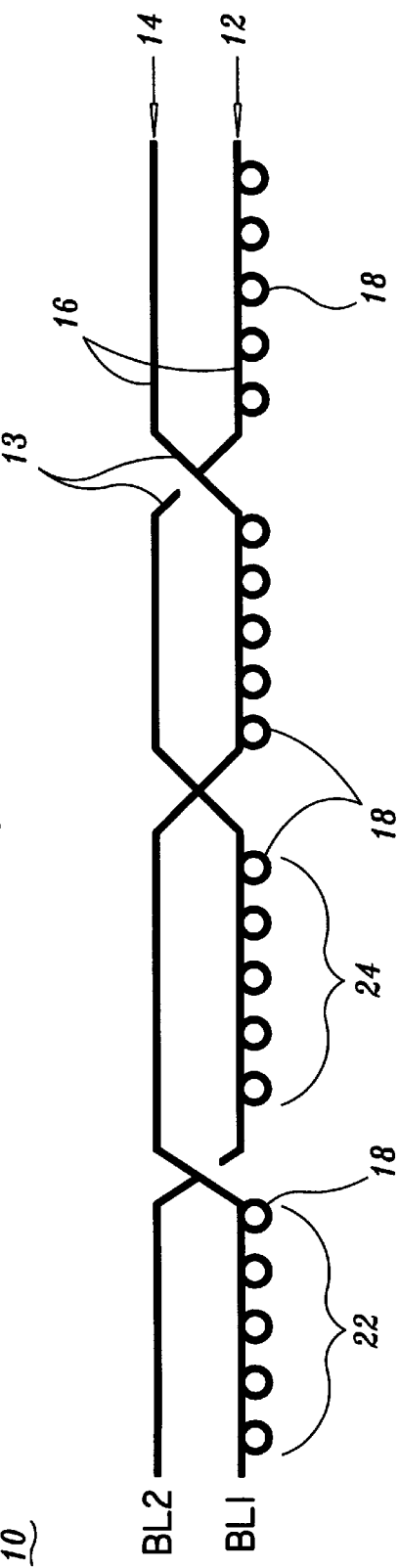
FIG. 1 is a side view of a global bitline pair in accordance with the prior art.
Figure 2:
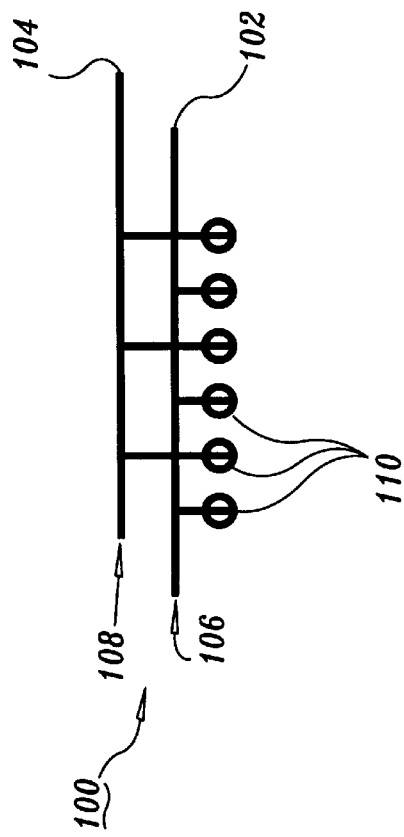
FIG. 2 is a side view of a local bitline pair in accordance with the prior art.
Figure 10:
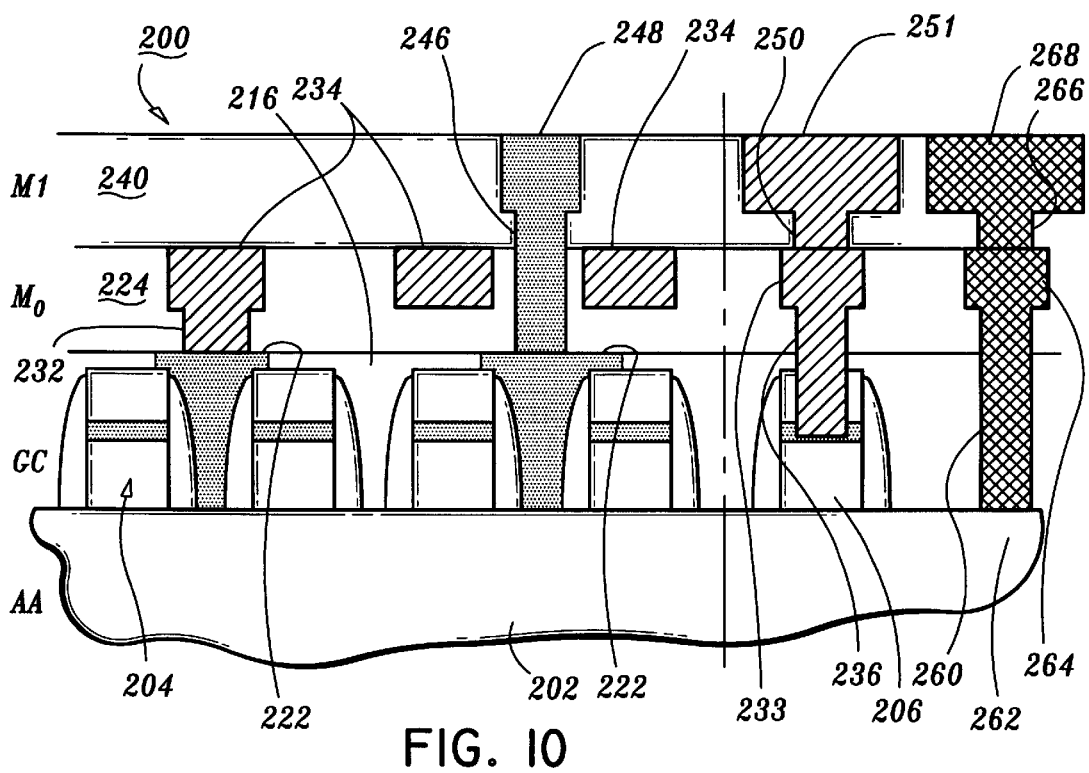
FIG. 10 is a cross-sectional view of the semiconductor device of FIG. 9 showing contacts and bitlines formed for the second layer of bitlines in accordance with the present invention.

Referring to FIG. 10, conductive material is deposited to form contacts 246, bitlines 248, contacts 250 and metal lines 251. Contacts 246 and 250 may be borderless contacts. This saves layout area and permits contact 246 to pass between bitlines 234. In accordance with the present invention, contacts 246 may preferably be formed as borderless contacts, i.e., directly deposited into a via or hole without a minimum distance needed between neighboring structures. This advantageously conserves layout area and permits interlevel contacts, i.e., between M0 and GC or M1 to GC, etc. This enables the realization of a split level bitline structure shown in FIG. 2 with only three contact levels. Contacts 246 and 250 comprise the third contact level. Conductive material employed for contacts 246, bitlines 248 and contacts 250 preferably includes tungsten, although other suitable materials may be employed. Advantageously, the conductive material for contacts 246, bitlines 248 and contacts 250 may be of a higher conductivity than the materials used for contact 136 of FIG. 3. This results in a performance gain for the semiconductor device.

FIG. 10 shows a contact 260 connecting to a diffusion region 262 in support area 214. Contact 260 is formed along with contact 236. A metal line 264 is formed with metal line 233. Contact 260 and metal line 264 may be formed together in a dual damascene process. Similarly, contact 266 is formed along with contact 250, and a metal line 268 is formed with metal line 251. Contact 266 and metal line 268 may also be formed together in a dual damascene process.

The present invention provides local bitlines on two Levels, for example M0 and Ml, to permit local bitline twist. This refers to the fact that a memory cell that employs a bitline on a first level is adjacent to memory cells all employing a bitline on a second level. Advantageously, the present invention employs only three masking steps, and the contacts formed in support area 214 may include borderless contacts which results in a layout area savings. Further, since the present invention enables the use of borderless contacts for contacts 246 and 250 with higher conductivity materials, lower resistance values are obtained over the prior art. Contacts 232, 236, 246, and 250 include a deposited conductive material which can have an increased conductivity, for example Tungsten, Aluminum, etc. If borderless contacts are employed, the contacts do not include diffusion barriers or other layers normally employed for bordered contacts.

Figure 11:
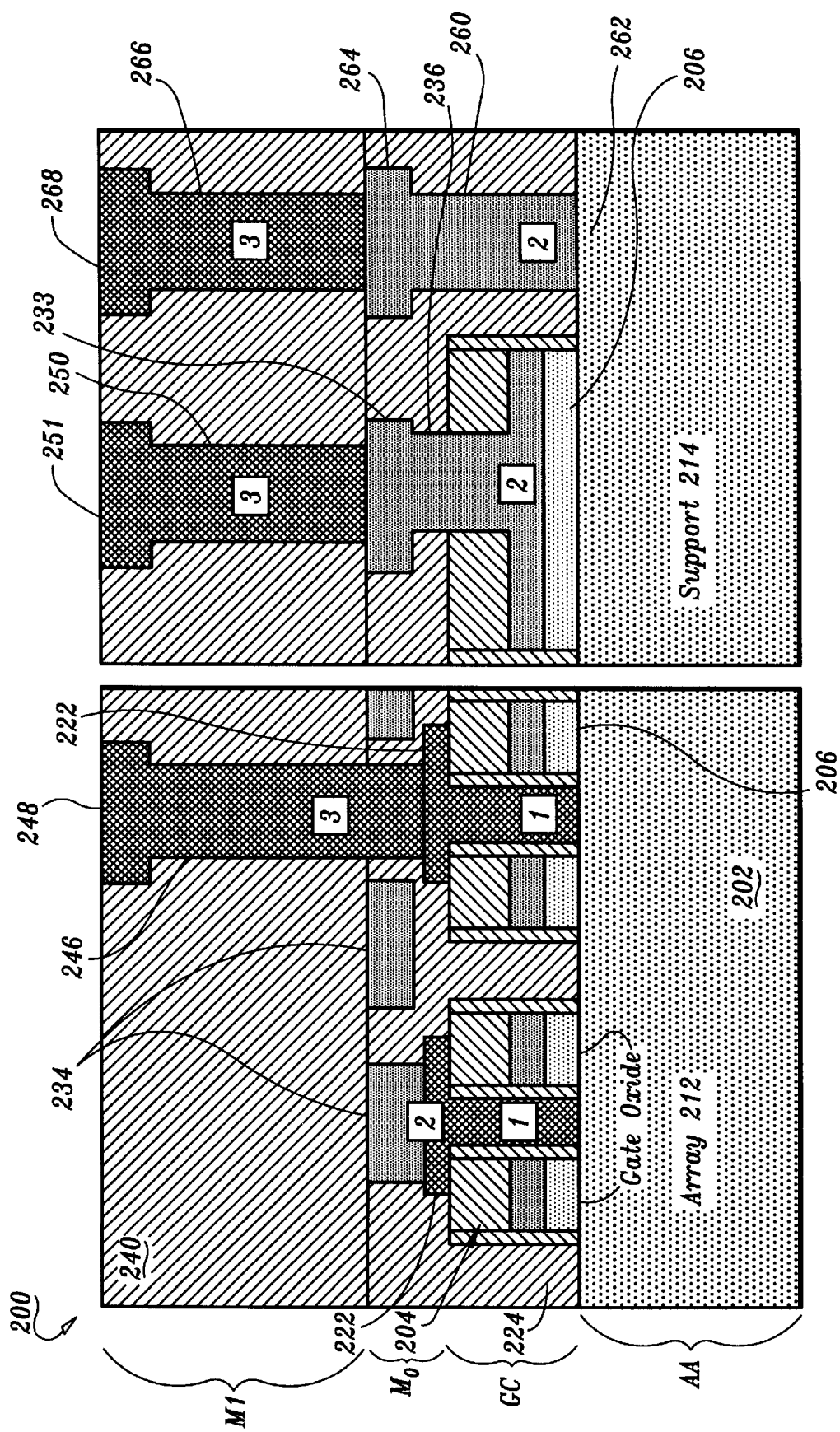
FIG. 11 is a cross-sectional view of the semiconductor device of FIG. 10 showing contacts levels labeled in accordance with the present invention.

Referring to FIG. 11, another cross-sectional view of device 200 is shown. The three contact levels provided by the present invention are labeled with numbers 1–3. For example, contact level 1 includes contacts 222. Contact level 2 includes contacts 232, 236 and 260. The contacts in level 2 may be simultaneously formed with conductors 234, 233 and 264. Contact level 3 includes contacts 246, 251 and 266. The contacts in level 3 may be simultaneously formed with conductors 248, 251 and 268.

Figure 12:
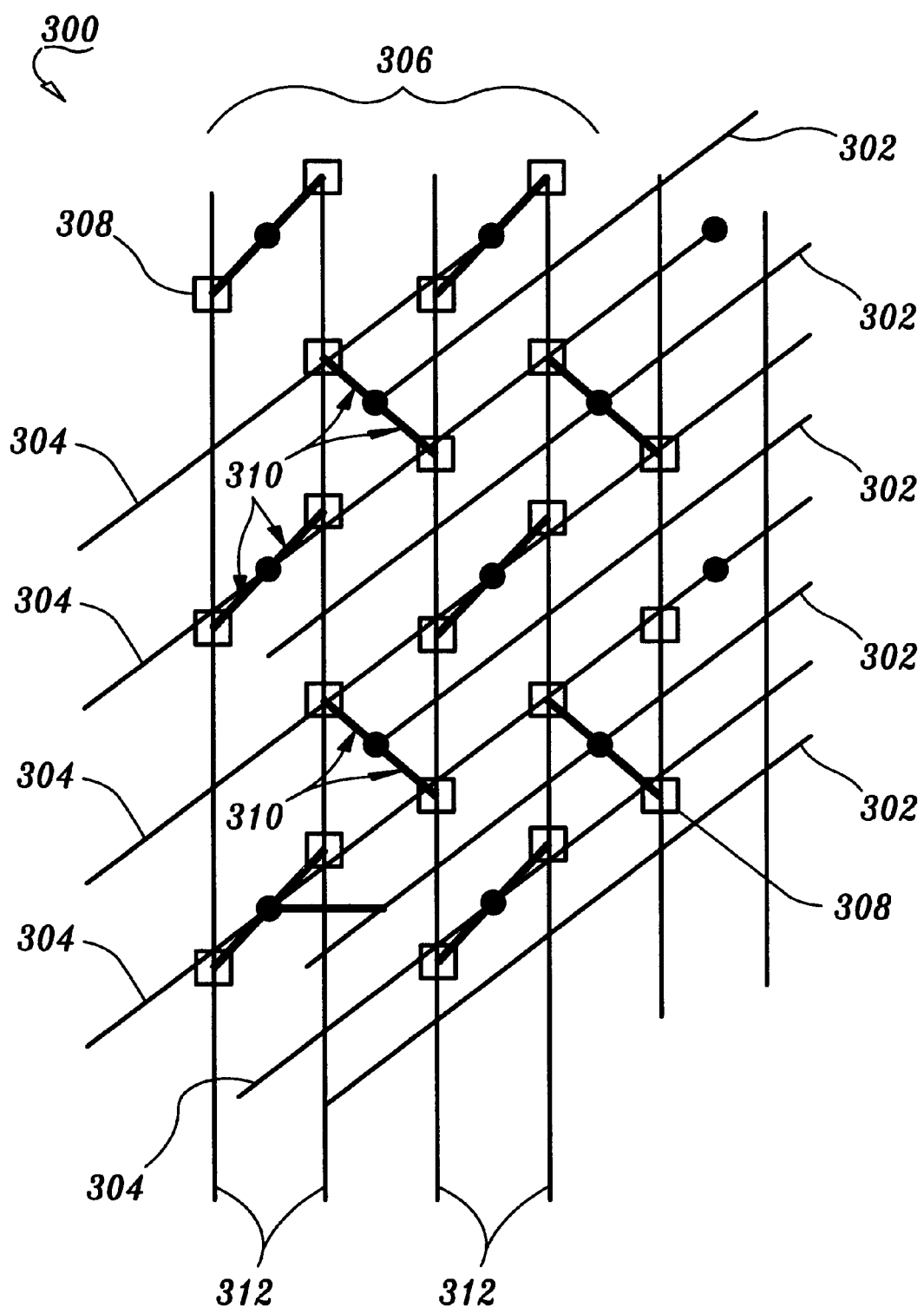
FIG. 12 is a schematic diagram showing connection between split-level bitlines and memory cells in accordance with the present invention.

Referring to FIG. 12, an illustrative top schematic view of a semiconductor device 300 in accordance with the present invention is shown. FIG. 11 is an example of one layout which may be employed by the present invention. Other layouts are possible as well. Bitlines 302 are on a first metal layer while bitlines 304 are on a second metal layer (i.e., on different levels). Bitlines 302 and 304 are disposed over a memory array 306. Memory array 306 includes a plurality of memory cells 308. Memory cells 308 each are surrounded by memory cells connected to a reference bitline as shown by contacts 310. Bitline 302 is an electrical reference to a bitline 304 which it is associated with (or paired to). Likewise, bitline 304 is an electrical reference to a bitline 302 which it is associated with (or paired to). Bitlines 302 and 304 run transversely with wordlines 312 as shown.

Having described preferred embodiments for locally folded split-level bitline wiring (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by letters patent is set forth in the appended claims.

What is claimed is:

1. A method for fabricating a semiconductor memory with a split level folded bitline structure consisting of three contact levels comprising the steps of:

forming gate structures for transistors in an array region and a support region of a substrate;

forming first contacts to diffusion regions, the first contacts being disposed in between the gate structures in the array region, the first contacts having a height being substantially the same for all first contacts;

forming second contacts and first level bitlines in the array region and the support region, the second contacts in the array region connecting some of the first contacts to the first level bitlines, and the second contacts in the support region connecting a first metal layer to the gate structures and diffusion regions formed in the support region; and forming third contacts and second level bitlines in the array region, the third contacts connecting some of the first contacts to the second level bitlines and the third contacts connecting a second metal layer to the first metal layer in the support region.

2. The method as recited in claim 1, wherein the first contacts are borderless contacts.

3. The method as recited in claim 1, wherein the first level bitlines and first metal layer are included on an M0 layer.

4. The method as recited in claim 1, wherein the second level bitlines and second metal layer are included on an M1 layer.

5. The method as recited in claim 1, wherein the first level bitlines function as an electrical reference for the second level bitlines and the second level bitlines function as an electrical reference for the first level bitlines.

6. The method as recited in claim 1, wherein the first and the second bitlines are local bitlines.

7. The method as recited in claim 1, wherein the third contacts are borderless contacts.

8. The method as recited in claim 1, wherein the first level bitlines are formed with the second contacts in a dual damascene process.

9. The method as recited in claim 1, wherein the second level bitlines are formed with the third contacts in a dual damascene process.

10. The method as recited in claim 1, wherein at least one of the first level bitlines and the second level bitlines include tungsten.

11. The method as recited in claim 1, wherein at least one of the second contacts and the third contacts include tungsten.

12. A method for fabricating a dynamic random access memory with a twisted split level folded bitline structure consisting of three contact levels comprising the steps of:

forming gate structures for transistors in an array region and a support region of a substrate;

forming first contacts to diffusion regions, the first contacts being disposed in between the gate structures in the array region, the first contacts having a height being substantially the same for all first contacts;

patterning a first dielectric layer over the gate structures in the array region and the support region;

forming second contacts and first level bitlines in the array region and the support region, the second contacts in the array region connecting some of the first contacts to the first level bitlines, and the second contacts in the support region connecting a first metal layer to the gate structures and diffusion regions formed in the support region, the second contacts being formed through the first dielectric layer;

patterning a second dielectric layer over the first level bitlines in the array region and the first metal layer in the support region; and forming third contacts and second level bitlines in the array region, the third contacts connecting some of the first contacts to the second level bitlines and the third contacts connecting a second metal layer to the first metal layer in the support region, the third contacts being formed through the second dielectric layer.

13. The method as recited in claim 12, wherein the first contacts are borderless contacts.

14. The method as recited in claim 12, wherein the first level bitlines and first metal layer are included on an M0 layer.

15. The method as recited in claim 12, wherein the second level bitlines and second metal layer are included on an M1 layer.

16. The method as recited in claim 12, wherein the first level bitlines function as an electrical reference for the second level bitlines and the second level bitlines function as an electrical reference for the first level bitlines.

17. The method as recited in claim 12, wherein the first and the second bitlines are local bitlines.

18. The method as recited in claim 12, wherein the third contacts are borderless contacts.

19. The method as recited in claim 12, wherein the first level bitlines are formed with the second contacts in a dual damascene process.

20. The method as recited in claim 12, wherein the second level bitlines are formed with the third contacts in a dual damascene process.

21. The method as recited in claim 12, wherein at least one of the first level bitlines and the second level bitlines include tungsten.

22. The method as recited in claim 12, wherein at least one of the second contacts and the third contacts include tungsten.

* * * * *